(12) United States Patent
Lavery et al.

(10) Patent No.: US 9,939,480 B2
(45) Date of Patent: Apr. 10, 2018

(54) CONTROLLING CLOCK MEASUREMENT WITH TRANSISTORS, CAPACITOR, OPAMP, ADC, EXTERNAL ENABLE

(71) Applicant: TEXAS INSTRUMENTS INCORPORATED, Dallas, TX (US)

(72) Inventors: Kevin Patrick Lavery, Sugar Land, TX (US); Steven Grey Howard, Plano, TX (US); Sunil Suresh Oak, Sugar Land, TX (US)

(73) Assignee: Texas Instruments Incorporated, Dallas, TX (US)

( * ) Notice: Subject to any disclaimer, the term of this patent is extended or adjusted under 35 U.S.C. 154(b) by 199 days.

(21) Appl. No.: 15/077,290

(22) Filed: Mar. 22, 2016

(65) Prior Publication Data

US 2016/0202300 A1    Jul. 14, 2016

Related U.S. Application Data

(62) Division of application No. 13/860,527, filed on Apr. 10, 2013, now abandoned.

(51) Int. Cl.
*H03M 1/06* (2006.01)
*G01R 29/26* (2006.01)
*G01R 31/317* (2006.01)

(52) U.S. Cl.
CPC ....... *G01R 29/26* (2013.01); *G01R 31/31709* (2013.01)

(58) Field of Classification Search
CPC ... G01R 29/26; G01R 31/31709; H03M 1/10; H03M 1/1009; H03M 1/1071; H03M 2201/63; H03M 3/38

USPC ................ 341/144, 118, 155, 120
See application file for complete search history.

(56) References Cited

U.S. PATENT DOCUMENTS

| | | | |
|---|---|---|---|
| 5,659,312 A | 8/1997 | Sunter et al. | |
| 5,668,549 A | 9/1997 | Opris et al. | |
| 5,703,588 A * | 12/1997 | Rivoir ................ | H03M 1/0604 341/118 |
| 5,861,774 A | 1/1999 | Blumenthal | |
| 5,861,826 A | 1/1999 | Shu et al. | |
| 5,909,186 A | 6/1999 | Gohringer | |
| 5,999,115 A | 12/1999 | Connell et al. | |
| 6,117,894 A | 9/2000 | Yamaguchi | |
| 6,229,465 B1 | 5/2001 | Bulaga et al. | |
| 6,326,909 B1 | 12/2001 | Yamaguchi | |

(Continued)

*Primary Examiner* — Jean B Jeanglaude
(74) *Attorney, Agent, or Firm* — Lawrence J. Bassuk; Charles A. Brill; Frank D. Cimino

(57) ABSTRACT

A measurement system includes a current source that is arranged to generate a current pulse to charge a capacitor as a function of an input clock signal. The accumulated charge on the capacitor is converted to a sample (e.g., resultant digital value) by an ADC (analog-to-digital converter). The samples can be aggregated as a distribution in order to estimate the jitter of the input clock signal. Variability of the measurement system can be minimized through calibrating the device-under-test at specific points of PVT (process, voltage, and temperature) conditions. A confidence metric such as a standard of deviation can be derived from the associated samples. The measurement system can be included on a substrate that includes the oscillator that generates the input clock signal.

16 Claims, 4 Drawing Sheets

(56) References Cited

U.S. PATENT DOCUMENTS

| | | | |
|---|---|---|---|
| 6,384,757 B1 * | 5/2002 | Kosonen | H03M 1/1038 341/120 |
| 6,658,368 B2 | 12/2003 | Wagner et al. | |
| 6,934,648 B2 | 8/2005 | Hanai et al. | |
| 7,012,979 B2 | 3/2006 | Hauptmann et al. | |
| 7,129,734 B2 | 10/2006 | Geiger et al. | |
| 7,158,899 B2 | 1/2007 | Sunter et al. | |
| 7,203,229 B1 | 4/2007 | Ishida et al. | |
| 7,205,924 B2 | 4/2007 | Vemulapalli et al. | |
| 7,262,727 B1 * | 8/2007 | Chen | H03M 1/682 341/144 |
| 7,375,669 B2 * | 5/2008 | Kim | H03M 1/682 341/144 |
| 7,522,077 B1 | 4/2009 | Itkin | |
| 7,587,647 B2 | 9/2009 | Olleta et al. | |
| 7,778,319 B2 | 8/2010 | Ichiyama et al. | |
| 7,898,452 B2 * | 3/2011 | Lewis | H03M 1/1038 341/155 |
| 7,911,220 B2 | 3/2011 | Takamiya et al. | |
| 7,912,166 B2 | 3/2011 | Hsu et al. | |
| 8,026,838 B2 * | 9/2011 | Hales | G01R 19/257 341/155 |
| 8,068,538 B2 | 11/2011 | Ichiyama et al. | |
| 8,283,933 B2 * | 10/2012 | Dasnurkar | G01R 29/26 324/555 |
| 8,310,385 B2 | 11/2012 | Dasnurkar | |
| 8,682,613 B2 | 3/2014 | Hamilton et al. | |
| 8,836,554 B2 * | 9/2014 | Hong | H03M 1/1061 341/118 |
| 2002/0030615 A1 | 3/2002 | Cherubal et al. | |
| 2002/0136337 A1 | 9/2002 | Chatterjee et al. | |
| 2003/0210028 A1 | 11/2003 | Beach et al. | |
| 2006/0038598 A1 | 2/2006 | Reilly et al. | |
| 2007/0109164 A1 | 5/2007 | Arias et al. | |
| 2007/0296440 A1 | 12/2007 | Takamiya et al. | |
| 2008/0125990 A1 | 5/2008 | Chang | |
| 2008/0238740 A1 | 10/2008 | Lewis et al. | |
| 2010/0026314 A1 | 2/2010 | Schuttert | |
| 2010/0194445 A1 | 8/2010 | Balakrishnan et al. | |
| 2011/0137604 A1 | 6/2011 | Dasnurkar | |
| 2012/0154193 A1 | 6/2012 | Chang et al. | |
| 2012/0154194 A1 | 6/2012 | Chang et al. | |
| 2014/0306689 A1 | 10/2014 | Lavery et al. | |

* cited by examiner

CONTROLLING CLOCK MEASUREMENT WITH TRANSISTORS, CAPACITOR, OPAMP, ADC, EXTERNAL ENABLE

This application is a divisional of prior application Ser. No. 13/860,527, filed Apr. 10, 2013, now abandoned.

BACKGROUND

The demand for higher performance electronic systems continues to require further increases in precision and costs of test equipment. For example, relatively expensive test equipment is used to precisely measure timing generators used to clock electronic systems. As the performance of devices incorporating the electronic systems increases, the expense of maintaining quality of the devices during manufacturing and production (as well as the expense of analyzing "failures" in devices returned from customers) also increases.

SUMMARY

The problems noted above can be solved in large part by a precision measurement system that, for example, is co-located on a device-under-test and is arranged to measure clock periods and estimate the associated jitter of the clock. The measurement system is arranged to generate a current pulse to charge a capacitor as a function of an input clock signal. The charge on the capacitor is converted to a sample (e.g., resultant digital value) by an ADC (analog-to-digital converter). Various samples can be aggregated as a statistical distribution in order to characterize the jitter of input clock signal. Variability of the precision measurement system can be minimized through calibrating the device-under-test at specific points of PVT (process, voltage, and temperature) conditions. A confidence metric such as a standard of deviation can be derived from the associated samples.

This Summary is submitted with the understanding that it is not be used to interpret or limit the scope or meaning of the claims. Further, the Summary is not intended to identify key features or essential features of the claimed subject matter, nor is it intended to be used as an aid in determining the scope of the claimed subject matter.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be example of that embodiment, and not intended to intimate that the scope of the disclosure, including the claims, is limited to that embodiment.

Certain terms are used throughout the following description—and claims—to refer to particular system components. As one skilled in the art will appreciate, various names may be used to refer to a component or system. Accordingly, distinctions are not necessarily made herein between components that differ in name but not function. Further, a system can be a sub-system of yet another system. In the following discussion and in the claims, the terms "including" and "comprising" are used in an open-ended fashion, and thus are to be interpreted to mean "including, but not limited to . . . . " Also, the terms "coupled to" or "couples with" (and the like) are intended to describe either an indirect or direct electrical connection. Thus, if a first device couples to a second device, that connection can be made through a direct electrical connection, or through an indirect electrical connection via other devices and connections.

Figure 1:
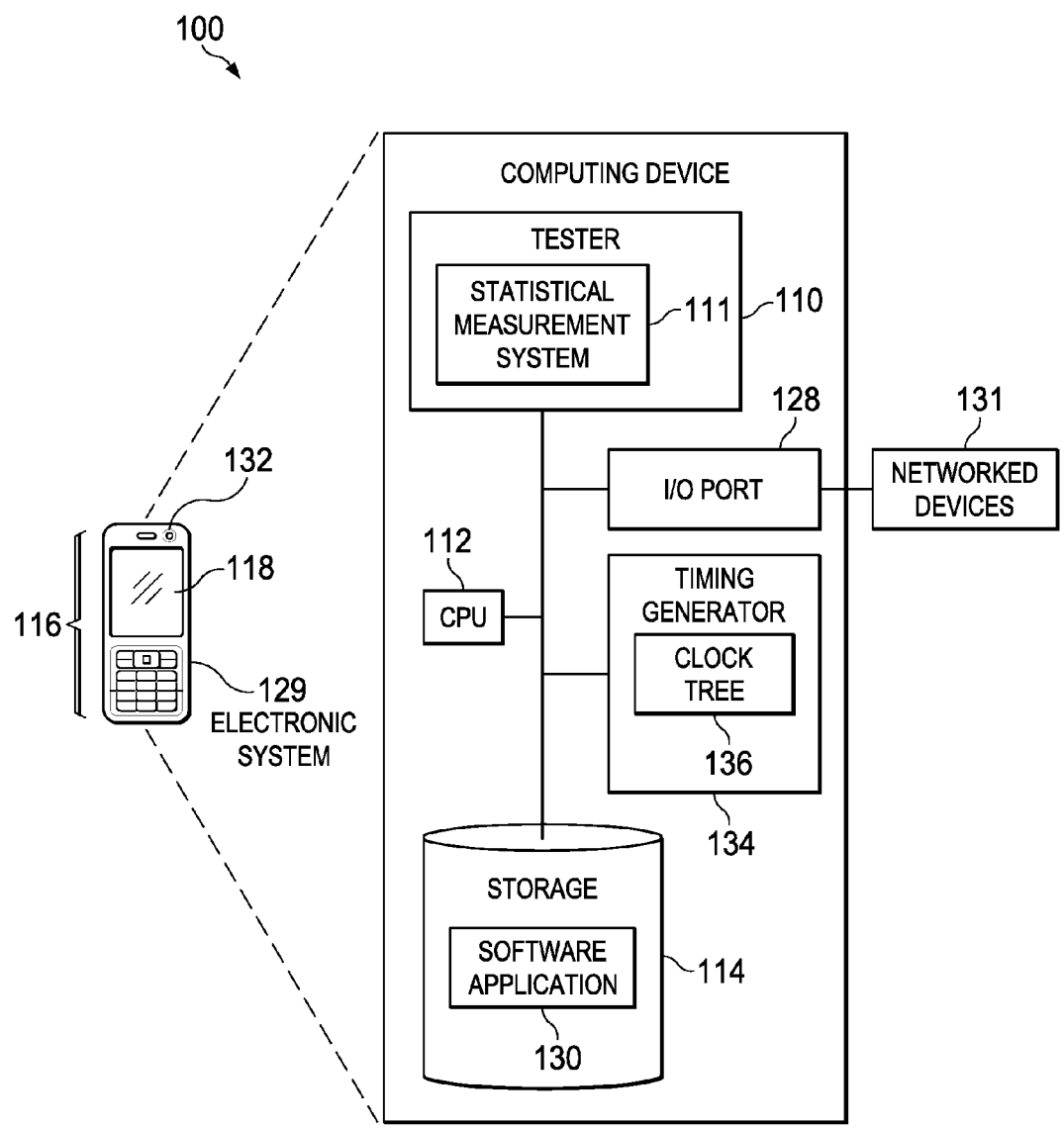
FIG. 1 shows an illustrative electronic device in accordance with example embodiments of the disclosure.

FIG. 1 shows an illustrative computing device 100 in accordance with preferred embodiments of the disclosure. For example, the computing device 100 is, or is incorporated into, an electronic system 129, such as a mobile phone, a personal digital assistant, a personal computer, automotive electronics control "box" or display, projection (and/or media-playback) unit, or any other type of electronic system.

In some embodiments, the computing device 100 comprises a megacell or a system-on-chip (SoC) which includes control logic such as a CPU 112 (Central Processing Unit), a storage 114 (e.g., random access memory (RAM)) and tester 110. The CPU 112 can be, for example, a CISC-type (Complex Instruction Set Computer) CPU, RISC-type CPU (Reduced Instruction Set Computer), MCU-type (Microcontroller Unit), or a digital signal processor (DSP). The storage 114 (which can be memory such as on-processor cache, off-processor cache, RAM, flash memory, or disk storage) stores one or more software applications 130 (e.g., embedded applications) that, when executed by the CPU 112, perform any suitable function associated with the computing device 100.

The tester 110 is a diagnostic system and comprises logic (embodied at least partially in hardware) that supports monitoring, testing, and debugging of the computing device 100 executing the software application 130. For example, the tester 110 can be used to emulate one or more defective or unavailable components of the computing device 100 to allow verification of how the component(s), were it actually present on the computing device 100, would perform in various situations (e.g., how the components would interact with the software application 130). In this way, the software application 130 can be debugged in an environment which resembles post-production operation.

The tester 110 includes a statistical measurement system 111 that is used, for example, to provide BIST (built-in self-test) functionality for the computing device 100. As discussed further below with respect to the accompanying figures, the incorporated test functions can lessen an amount of (e.g., external) test equipment that would otherwise be required to verify the proper operation of each computing device 100 that is manufactured. For example, a "go/no-go test" can be initiated at startup time (and/or at defined intervals or requested times) with the result stored in a status register. Also, a quality metric (such as a standard of deviation) of the jitter of an internal clock can be generated and presented to an off-chip device. The statistical measurement system 111 includes functionality for testing clock periods in a way that is substantially consistent over various points of PVT conditions.

The CPU 112 comprises memory and logic that store information frequently accessed from the storage 114. The computing device 100 is often controlled by a user using a UI (user interface) 116, which provides output to and receives input from the user during the execution the software application 130. The output is provided using the display 118, indicator lights, a speaker, vibrations, image projector 132, and the like. The input is received using audio and/or video inputs (using, for example, voice or image recognition), and mechanical devices such as keypads, switches, proximity detectors, and the like. The CPU 112 and tester 110 is coupled to I/O (Input-Output) port 128, which provides an interface that is configured to receive input from (and/or provide output to) peripherals and/or computing devices 131, including tangible media (such as flash memory) and/or cabled or wireless media (such as a Joint Test Action Group (JTAG) interface). These and other input and output devices are selectively coupled to the computing device 100 by external devices using wireless or cabled connections.

The computing device 100 includes timing generator 134, which can be arranged in a separate substrate from or the same substrate of the tester 110. Timing generator 134 can be a phase-locked loop (PLL), oscillator, multivibrator, bistable loop, periodic function generator, and the like. Timing generator 134 is typically coupled to a clock tree 136 that is in turn coupled to the CPU 112 and other components (including, e.g., the statistical measurement system 111) of the computing device 100.

The statistical measurement system 111 is arranged to make high resolution measurements of a PLL period. Accordingly, the statistical measurement system 111 is suitable for measuring time intervals, characterization, frequency measurements, jitter, and other such measurements. In an example embodiment, the statistical measurement system 111 is arranged to measure the periods of a large number of pulses (e.g. 10,000) in order to determine a distribution of the clock periods using resultant digital values produce by an ADC in response to a voltage generated across a timing capacitor 248 (as described below). This logged data can be readout from storage 114 or processed within the computing device 100 in order to determine a quality metric such as the average number of ADC counts, the standard deviation of the ADC counts, and/or other results that are calculated from the logged data.

The statistical measurement system 111 can use processing resources (such as CPU 112 or provided in measurement system controller 220, described below) in order to derive quality metrics such as the average (or arithmetic mean) and/or standard of deviation of the clock periods. The ADC counts can be calibrated in terms of picoseconds using a computed average from this circuit. Using ADC counts that are calibrated using terms of picoseconds is substantially more accurate than (for example) using a substantially less accurate frequency measurement obtained from of a node of the clock tree 136. (A substantially less accurate measurement is, for example, a measurement that would typically include hysteresis in switching and parasitic delays introduced by circuitry and "interconnects" used to construct the clock tree.) Thus, the accuracy of the propagated clock can be determined by comparing the propagated clock to the (internal) statistical measurement system 111. The statistical measurement system 111 is arranged to compute ADC counts for a variety of typical operating conditions; accordingly, the statistical measurement system 111 can be used to calibrate, for example, the timing generator 134 without requiring externally generated (e.g., to the substrate of the computing device 100) stimulus.

Figure 2:
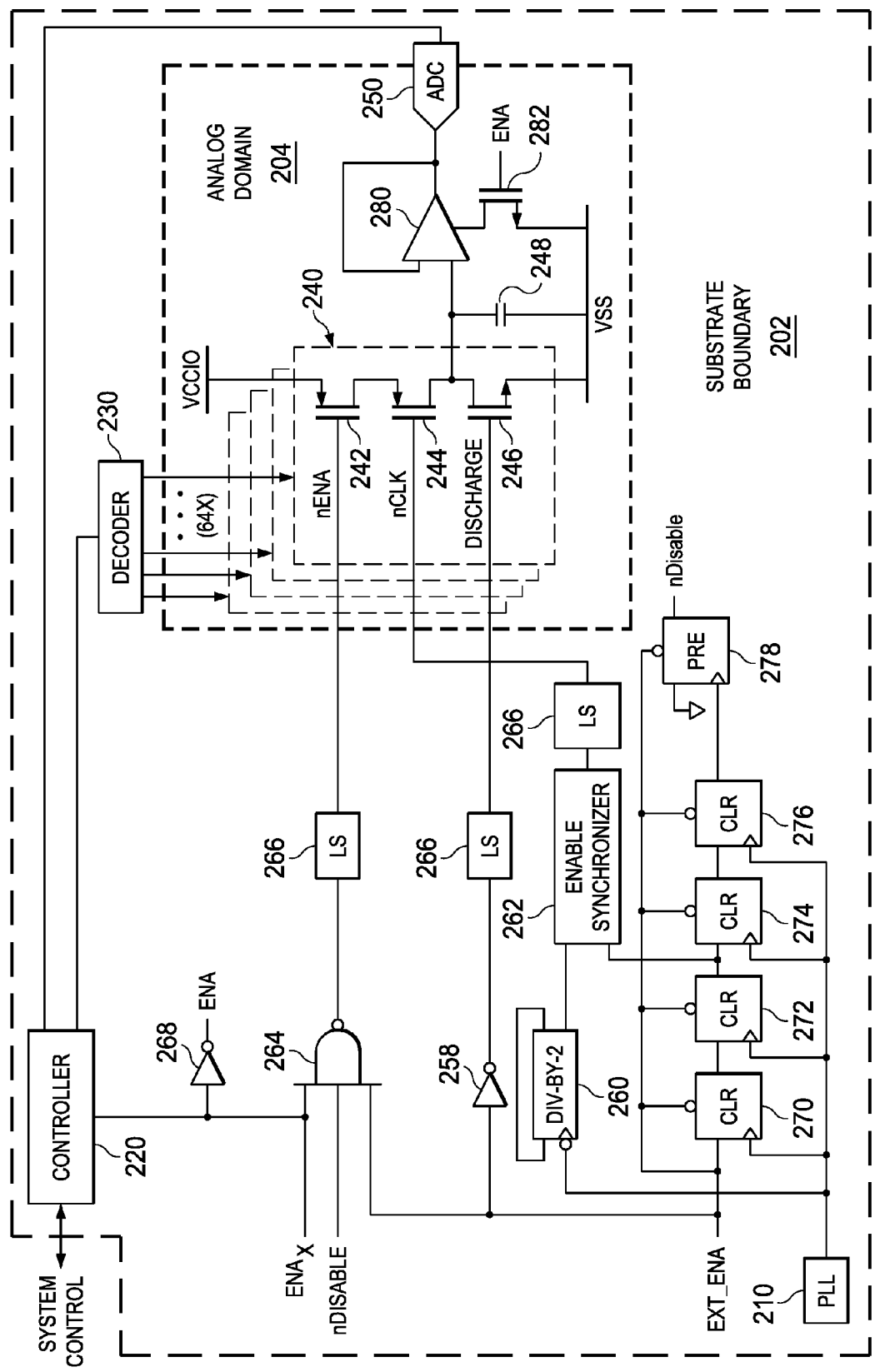
FIG. 2 is a block diagram illustrating a measurement system for performing timing measurements in accordance with example embodiments of the disclosure.

FIG. 2 is a block diagram illustrating a measurement system for performing timing measurements in accordance with example embodiments of the disclosure. In general, the measurement system 200 can be included as a subsystem in statistical measurement system 111. Measurement system 200 can include (or otherwise be coupled to an output of) a timing generator such as a phase-locked loop (PLL) 210 that is arranged to provide a timing signal that is to be measured by the measurement system 200. Although the PLL 210 is illustrated as being implemented on substrate 202, the PLL 210 in various implementations can be located on a substrate that is different from substrate 202 (which can include—or exclude—the measurement system 200 and/or the computing device 100).

Controller 220 is responsive to system control signals (such as received from CPU 112 and/or a device external to computing device 100). The controller 220 is arranged (e.g., through control registers and interface logic) to enable (e.g., arm or activate), trigger, convert, read, disable, and reset measurement of the PLL 210 (or other timing signal to be measured) as described following.

For example, the enable signal ENAx (asserted by controller 220) is coupled to the inputs of logic gate 264 and inverter 268. The output (e.g., enable signal ENA) of the inverter 268 is coupled to control transistor 282, whereas the output (e.g., analog enable signal nENA) of logic gate 264 is coupled to a gate of a PMOS (positive-type metal-oxide-semiconductor) transistor 242 via level shifter (LS) 266. When the output of logic gate 264 is asserted (low), the gate of PMOS transistor 242 is activated and current is permitted to flow through the source and drain of the PMOS transistor 242 (thereby allowing PMOS transistor 244 to conduct charge when the PMOS transistor 244 is activated as discussed below).

An external enable signal EXT_ENA (generated by an external controller such as CPU 112) is coupled to an input of logic gate 264, an input of inverter 258, a logic input (as well the clear input) of each of the flip-flops 270, 272, 274, and 276 and a preset input of flip flop 278. When the external enable signal EXT_ENA is asserted, the clear inputs of flip flops 270, 272, 274, and 276 and the preset input of flip flop 278 are all inactivated, with the state of flip flops 270, 272, 274, and 276 being cleared and the state of flip flop 278 being preset. The PLL 210 is coupled to drive the (e.g., rising-edge transitioned) clock inputs of flip flops 270, 272, 274, and 276. Accordingly, the flip flops 270, 272, 274, and 276 are used to synchronize the sampling of the PLL output states with respect to a rising edge of the external enable signal EXT_ENA (when the external command signals and the PLL output states are in differing clock domains, for example).

Flip flop 260 has an input connected to the output of PLL 210 and generates an output signal PLL/2 that has a frequency that is half the frequency of signal PLL. Flip flop 260 is arranged to toggle its output state in response to a falling edge of signal PLL, as explained in connection with FIG. 3, or in response to a rising edge of signal PLL, as explained in connection with FIG. 4. The output of flip flop 260 is connected to a first input of enable synchronizer 262. Flip flops 270 and 272 are arranged, for example, to provide a "start sample" trigger signal to a second input of enable synchronizer 262. The output (analog clock signal nCLK) of enable synchronizer 262 is asserted (e.g., low) when the output of divider 260 goes low. (Divider 260 is arranged to toggle its output every other negative-going edge of the PLL output.) The output of the enable synchronizer 262 is coupled to the gate of PMOS transistor 244 via level shifter 266. When signal nCLK is asserted, current is permitted to flow through the source and drain of the PMOS transistor 242, thus initiating (and continuing) an accumulation of the charge in the timing capacitor 248.

Flip flops 274, 276, and 278 are arranged, for example, to provide an nDISABLE or "stop sample" signal to an nDISABLE input of logic gate 264. Flip flop 278 is arranged to transition low in response to a rising edge the output of flip flop 276. Accordingly the "stop sample" signal is asserted two clocks after the "start sample" trigger. In response to the "stop sample" signal, the output of the logic gate 264 turns "off" the gate of PMOS transistor 242 via level shifter 266. This blocks current from flowing through the source and drain of the PMOS transistor 242, thus stopping the accumulation of the charge in the timing capacitor 248. As described below, the accumulated charge is measured to provide an indication of the length of time over which the accumulated charge is accumulated.

The controller 220 is also responsive to system control signals to control the amount of charge presented to timing capacitor 248 (e.g., to enhance accuracy over measurement windows of selected durations). The controller 220 is arranged to control the rate of charge that is presented to the timing capacitor 248. The rate is controlled by using decoder 230 to select one or more switches 240 (for clarity, not all switches 240 are shown). Each switch 240 includes PMOS transistors 242 and 244 and NMOS (negative-type metal-oxide-semiconductor) transistor 246, wherein the transistors 242, 244, 246 are arranged as a transistor "stack" (e.g., having sources and drains coupled in series between a positive supply rail VCCCIO and a negative supply rail VSS). Each switch 240 is coupled in parallel with the other switches 240 such that by selecting the numbers and sizes of the channel of each switch, the magnitude of the rate of the flow of charge (e.g., charging current) can be selected (e.g., to selectively vary a charging rate). For example, a greater number of switches 240 can be selected when measuring shorter measurement windows and a lesser number of switches 240 can be selected when measuring longer measurement windows.

The controller 220 is also responsive to system control signals to control the ADC 250. The ADC 250 is arranged to provide a digital value that provides an indication of an amount of charge stored on the timing capacitor to 248 (after, for example, the "stop sample" signal is asserted). The ADC 250 can be triggered by controller 200 (e.g., via enabling NMOS transistor 282) and, when finished, provide the digital value (sample) to the controller 220.

The controller 220 is arranged, for example, to enable a unity gain operational amplifier (op-amp) 280 at the end of an analog-to-digital conversion. The unity gain operational amplifier 280 is enabled by NMOS transistor 282 in response the assertion of the enable signal ENA by inverter 268, for example. The unity gain operational amplifier 280 is arranged as a unity gain biased operational amplifier that converts the charge stored on timing capacitor 248 into an analog voltage that is to be sampled by ADC 250. The current source and buffering of the operational amplifier 280 is arranged to produce less than 400 µV RMS (root-mean-square) noise because the length of the statistics window (2N µs over which "n" samples are produced) is relatively long. For example, when N=10,000, the length of the statistics window is around 20 milliseconds.

To enhance the accuracy of the measurement system 200 over various PVT conditions, the operational amplifier 280 is formed using transistors of process technology that is suited for the analog domain 204 (e.g., VCCIO logic transistors). Operational amplifier 280 typically has high impedance signal inputs, and thus does not substantially drain the accumulated charge stored on timing capacitor 248. (For example, substantially draining the charge can include an amount that measurably decreases the accuracy of the measurement of the integrated charge.) The charge stored in timing capacitor 248 can be dissipated (e.g., shunted to VSS) by turning NMOS transistor 246 "ON" in response to the de-assertion of the external enable signal as transmitted via inverter 258 and level shifter 266.

The bank of switches 240, the timing capacitor 248, the NMOS transistor 282, and a portion of the ADC 250 are included as an analog domain 204, in which timing information is accumulated, stored, and converted using analog technology. The measurement system 200 can be calibrated at each PVT condition so that variability of the delay element (e.g., flip flops 270, 272, 274, 276, and 278) is not detrimental to the accuracy of measurements taken over a set of various PVT conditions. The variability of the offset and gain of the operational amplifier 280 (as well as the offset and gain of the ADC 250) and the over various PVT conditions can be minimized in accordance with the calibration techniques (discussed further, below). The operational amplifier 280 can be any suitable operational amplifier that does not exhibit a substantially large gain non-linearity (e.g., a substantially large gain non-linearity is a non-linearity that would cause the calibration to fail in accordance with application tolerances).

In an example embodiment, a current source is arranged as 64 switches 240 arranged in a bank (not all switches 240 are shown for clarity) wherein each switch 240 is independently-controlled (e.g., by the measurement controller 220 via decoder 230). The amount of current carried by each switch 240 can be the same as (or different from) other switches 240. Selected switches in the bank can be simultaneously enabled such that parallel current-paths through each of the enabled switches 240 provides provide a current that is selectively scaled for charging the sampling capacitor. (For example, the amount of current can be selected in view of an expected frequency of a timing signal generator that is to be calibrated.) A pulse of current is generated in response to a clock signal that is received from a timing signal generator (such as PLL 210).

Each switch 240 provides a current path that is controlled by the PMOS transistors 242 and 244. PMOS transistor 242 acts as an enable and turned off dynamically after a particular current path is has been established in response to control bits in the controller 220. The PMOS transistor 242 is turned on (e.g., in response to control bits) before the current pulse is generated and is turned off after the (single) current pulse is measured. The PMOS transistor 244 is enabled by a low phase of a control signal generated by the (divide-by-two) flip flop 260. Accordingly, the current pulse is generated (for example) for a single clock cycle (that is overlapped by a low phase of the control signal generated by flip flop 260).

As mentioned above, the current pulse is used to charge the timing capacitor 248. In an example embodiment, the timing capacitor 248 is a 0.5 pico-Farad capacitor formed using mid-range transistor technology (having an area of around 50 µm$^2$) for reduced leakage. The timing capacitor 248 is charged at a rate of 0.6 volts per nanosecond when all switches 240 are enabled. Accordingly, a one picosecond variation in a current pulse being measured produces a 0.6 millivolt delta in the charge stored by the timing capacitor 248. Assuming a worst case of selected PVT conditions, the 0.6 millivolt delta produced in the analog domain 204 portion of the sampling circuit is appropriately sized for a three-volt ADC 250, where a resolution of 12 bits implies a measurement quantum of 0.75 millivolts. For a 0.5 pico-Farad capacitor, each of the 64 replicated switches 240 is able to source 4 microamperes in respective worst-case PVT conditions. (When the PLL 210 is not dependent upon the 3.3 volt supply used for the analog domain 204, the response of the worst-case conditions varies as a function of temperature and process and does not necessarily vary as a function of voltage). Accordingly, the selected example capacities for the timing capacitor 282 and switches 240 capacitor and current sizes allows a frequency measurement range of 20 MHz to 330 MHz. For example, a 16 µA circuit (e.g., using one or more switches 240) results in a timing capacitor voltage delta of 1.6 V when measuring a 20 MHz clock, whereas 64 simultaneously enabled 4 µA (for example) circuits results in a timing capacitor voltage delta of 1.54 V when measuring a 333 MHz clock.

Figure 3:
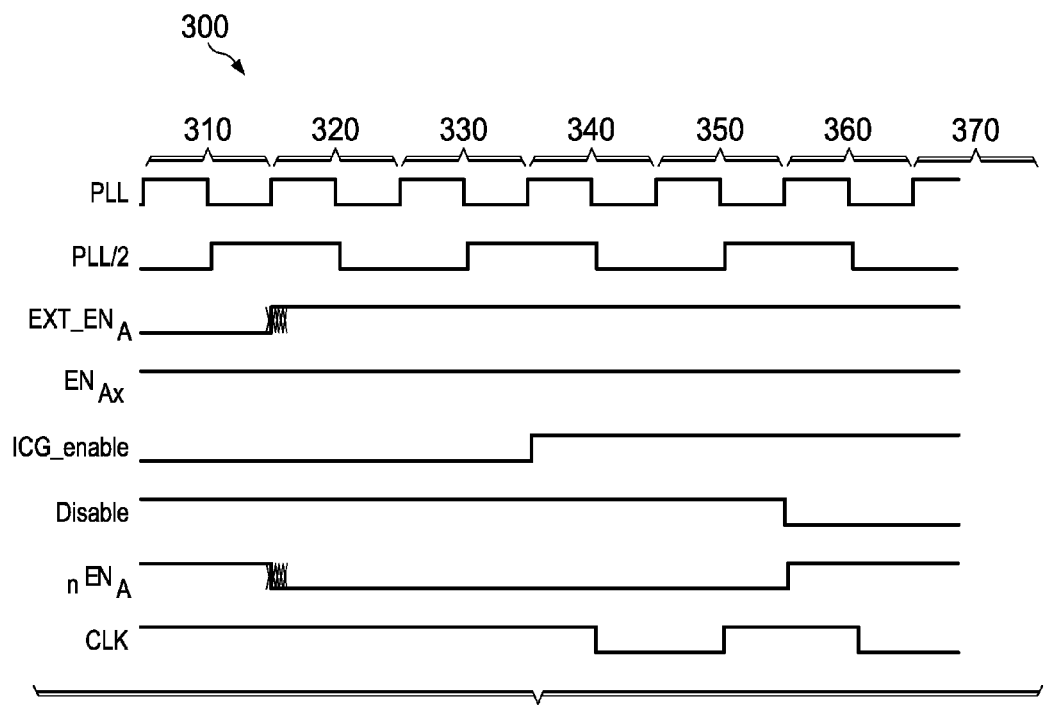
FIG. 3 is a timing diagram that illustrates a high-resolution pulse measurement in accordance with example embodiments of the disclosure.

FIG. 3 is a timing diagram that illustrates a high-resolution pulse measurement in accordance with example embodiments of the disclosure. Timing diagram 300 includes time periods 310, 320, 330, 340, 350, 360, and 370. Signal PLL as a repetitive waveform that is repeated every period (e.g., the waveform from period 310 is repeated by the oscillator generating the signal PLL). Signal PLL/2 is (for example) generated by flip flop 260 and has a frequency that is half the frequency of signal PLL. Flip flop 260 is arranged to toggle its output state in response to a falling edge of signal PLL and thus (for example) has a rising edge in period 310 and a falling edge in period 320.

To generate signals nENA and nCLK, signal EXT_ENA is asserted (around the end of period 310 and/or the beginning of period 320). In response, signal nENA is inverted around the beginning of period 320. Signal EXT_ENA can be asserted using a timing that is synchronous to a rising edge of a signal that is used to trigger the ADC 250 (although signal EXT_ENA is not necessarily synchronized with the output signal of the PLL).

As illustrated in FIG. 3, the EXT_ENA signal violates the setup time of flip flop 270 and is synchronized to the next rising edge of signal PLL (at the beginning of period 330, for example). Accordingly, an unsynchronized EXT_ENA signal is arranged to enable the top current-sourcing transistor 242 (e.g., when signal ENAx is asserted high and signal nDisable is asserted high). A synchronized derivative (a current control gate signal ICG_enable that is internal to the enable synchronizer 262) of the EXT_ENA signal enables the synchronizer 262 around the start of period 340 (after signal PLL/2 transitions high around the middle of period 330 and signal PLL transitions high around the end of period 330). The output (signal nCLK) of enable synchronizer 262 is maintained at a high logic level except when signal PLL/2 is low. Transistor 244 is arranged to toggle in response to the gated clock (nCLK) from the enable synchronizer 262. After the end of the low pulse of signal nCLK (e.g., as applied to the gate of transistor 244 during a last half of period 340 and a first half of period 350), the nDisable signal is asserted low, disabling the (top) transistor 242. Thus, the timing capacitor 248 is arranged as a sample-and-hold capacitor that is charged for a single PLL clock period.

Figure 4:
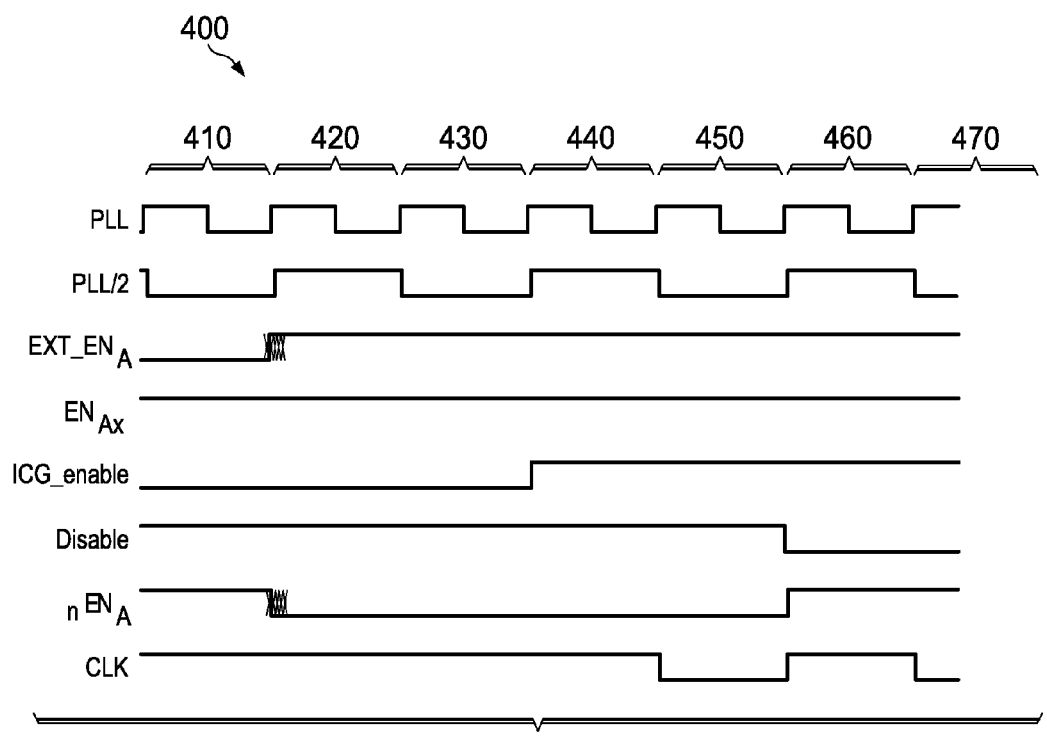
FIG. 4 is a timing diagram that illustrates another high-resolution pulse measurement in accordance with example embodiments of the disclosure.

FIG. 4 is a timing diagram that illustrates another high-resolution pulse measurement in accordance with example embodiments of the disclosure. Timing diagram 400 includes time periods 410, 420, 430, 440, 450, 460, and 470. Signal PLL as a repetitive waveform that is repeated every period. Signal PLL/2 is (for example) generated by flip flop 260 and has a frequency that is half the frequency of signal PLL. Flip flop 260 is arranged to toggle its output state in response to a rising edge of signal PLL and thus (for example) has a rising edge at the beginning of period 420 and a falling edge at the beginning of period 430.

To generate signals nENA and nCLK, signal EXT_ENA is asserted (around the end of period 410 and/or the beginning of period 420). In response, signal nENA is inverted around the beginning of period 420. Signal EXT_ENA can be asserted using a timing that is synchronous to a rising edge of a signal that is used to trigger the ADC 250 (although signal EXT_ENA is not necessarily synchronized with the output signal of the PLL).

As illustrated in FIG. 4, the EXT_ENA signal violates the setup time of flip flop 270 and is synchronized to the next rising edge of signal PLL (at the beginning of period 430). Accordingly, an unsynchronized EXT_ENA signal is arranged to enable the top current-sourcing transistor 242 (e.g., when signal ENAx is asserted high and signal nDisable is asserted high). A synchronized derivative (a current control gate signal ICG_enable that is internal to the enable synchronizer 262) of the EXT_ENA signal enables the synchronizer 262 around the beginning of period 440 (after signal PLL/2 transitions high around the end of period 430 and signal PLL transitions high around the end of period 430). The output (signal nCLK) of enable synchronizer 262 is maintained at a high logic level except when signal PLL/2 is low. Transistor 244 is arranged to toggle in response to the gated clock (nCLK) from the enable synchronizer 262. After the end of the low pulse of signal nCLK (and is applied to the gate of transistor 244), the nDisable signal is asserted low, disabling the (top) transistor 242. Thus, the timing capacitor 248 is arranged as a sample-and-hold capacitor that is charged for a single PLL clock period.

Figure 5:
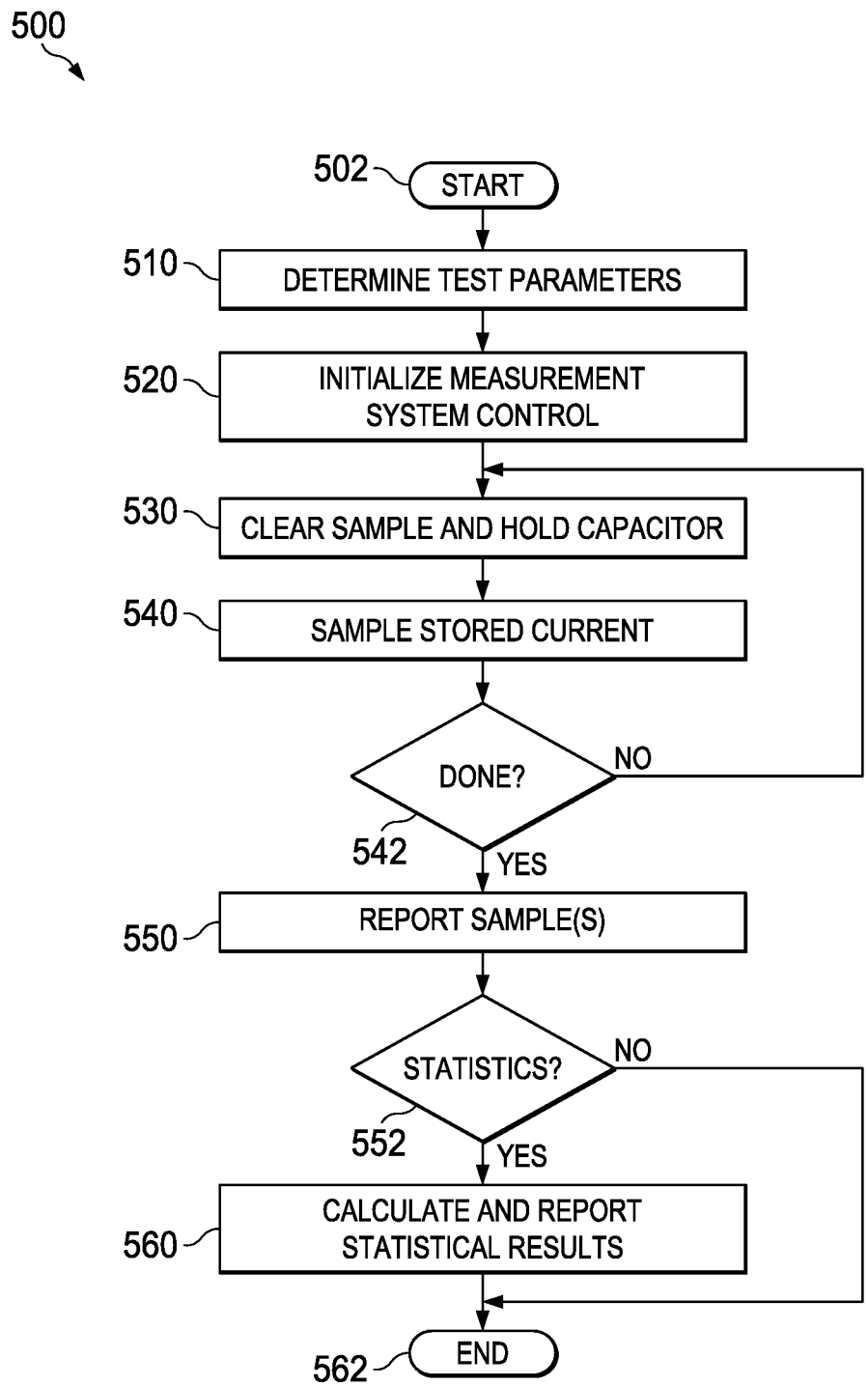
FIG. 5 is a flow diagram illustrating high-resolution pulse measurement and characterization in accordance with example embodiments of the disclosure.

FIG. 5 is a flow diagram illustrating high-resolution pulse measurement and characterization in accordance with example embodiments of the disclosure. The program flow illustrated herein is provided as an example, and thus various operations (and various portions of the operations) within the program flow can be performed concurrently and/or in an order that is not necessarily the same as the program flow illustrated herein (including, for example, using logical substitutions and reordering made in accordance with DeMorgan's theorems and Boolean algebra). Program flow 500 begins at node 502 and proceeds to operation 510.

In operation 510, test parameters are determined. For example, the period of an expected timing signal is determined. The rate of current for charging the timing capacitor is selected in response to factors such as noise of an operational amplifier (e.g., used as a unity gain amplifier for amplifying the voltage of the timing capacitor), resolution and voltage of an ADC (e.g., that is used to provide a digital value of the output of the operational amplifier), and relative sizes of current switches that are arranged as parallel current sources. The timing signal can be provided from an oscillator that is arranged on the same substrate as the operational amplifier In operation 520, the controls of the measurement system are initialized. For example, a measurement system controller can be programmed to assert an enable signal that arms the measurement system 200. The measurement system controller can also be programmed to enable the ADC 250 and to read the result of a conversion from the ADC 250. The measurement system controller can also be programmed to select which current switches are to be used to provide current for charging the timing capacitor.

In operation 530, the sample-and-hold capacitor is cleared. For example, the sample-and-hold capacitor can be cleared by selectively grounding a positive terminal of the sample-and-hold capacitor. The sample-and-hold capacitor is cleared to ensure no residual charge remains in the sample-and-hold capacitor, which might otherwise provide incorrectly high voltage levels when measuring the voltage across the sample-and-hold capacitor.

In operation 540, the pulse width of an input clock is measured. For example, an external enable signal is received. The received enable signal is synchronized to the clock domain of the input clock being measured and used used to trigger a programmable current source that supplies current to the timing capacitor. The timing capacitor accumulates the charge provided by the programmable current source until a disable signal is asserted in response to a successive edge of input clock. The accumulated charge on the timing capacitor is buffered by a unity gain operational amplifier which produces an output voltage that provides an indication of the amount of accumulated charge. The ADC (e.g., triggered by the system measurement controller, disable signal, external signal, timer, and the like) converts the output voltage of the operational amplifier to a timing sample (e.g., resultant digital value) that provides an indication of the amount of accumulated charge.

In operation 542, a determination is made as to whether more timing samples are to be converted. If the determination is made that more timing samples are to be converted, operational flow proceeds to operation 530 (where the sample-and-hold capacitor is cleared in preparation for the success of timing measurement). If the determination is made that no more timing samples are to be converted (e.g., at the close of the statistical window), operational flow proceeds to operation 550.

In operation 550, the timing samples are reported. For example, the measurement system controller can store each timing sample after each conversion by the analog-to-digital converter. At the end of one or more sample periods, each corresponding timing sample is reported to (for example) a system processor. The system processor can evaluate the reported timing samples against quality metrics to determine a level of quality of the input clock being measured.

In operation 552, a determination is made as to whether a statistical analysis is to be performed using the reported timing samples. If the determination is made that a statistical analysis to be performed using the recorded timing samples, operational flow proceeds to operation 560. If the determination is made that a statistical analysis is not to be performed using the recorded timing samples, operational flow proceeds to node 562 (where the operation flow is terminated).

In operation 560, a statistical analysis is performed using the report to the timing samples. For example, one or more of the reported samples can be analyzed to produce one or more quality metrics that provide an indication of a level of quality of the input clock being measured. One metric that can be generated is a standard of deviation. Accordingly, multiple samples can be evaluated within a system such that a single quality metric can be produced within the confines of a single system and/or substrate (e.g., thus minimizing the amount of communications, test equipment, "pin-out" requirements, and the like of the system and/or substrate that includes the measurement system). When the statistical results are calculated, one or more quality metrics can be reported to a system or device that respectively includes the substrate or system. When the statistical results are reported, the process flow (for example) is terminated at node 562.

The resolution of the resultant digital value of the measurement of the pulse width of an input clock (e.g., of operation 540) and the attendant quality metrics (e.g., reported in operation 560) in an example embodiment is subject to a total measurement error of around plus-or-minus two counts as measured by the above-described analog-to-digital converter having a voltage range of around three volts and a quantization range of 12-bits. The measurement error is a sum of different errors such as nonlinearity in gain and offset errors that are present in both the analog-to-digital converter and the operational amplifier.

The voltage generated on the sample-and-hold capacitor can be expressed as:

$$V = \frac{IT_{pulse} - I_{leakage}T_{end\_start\_pulse}}{C} \quad (1)$$

where V is voltage, I is current, T is time, and C is capacitance. The variation in the voltage due to a range of PVT conditions can be expressed as:

$$\Delta V = \quad (2)$$

$$\sqrt{\left(\frac{\partial V}{\partial I_{generate}}\Delta I_{generate}\right)^2 + \left(\frac{\partial V}{\partial I_{leakage}}\Delta I_{leakage}\right)^2 + \left(\frac{\partial V}{\partial T_{pulse}}\Delta T_{pulse}\right)^2 + \left(\frac{\partial V}{\partial T_{end\_start\_pulse}}\Delta T_{end\_start\_pulse}\right)^2 + \left(\frac{\partial V}{\partial C}\Delta C\right)^2}$$

$$\Delta V = \sqrt{\left(\frac{T_{pulse}}{C}\Delta I_{generate}\right)^2 + \left(\frac{T_{end\_start\_pulse}}{C}\Delta I_{leakage}\right)^2 + \left(\frac{I_{leakage}}{C}\Delta T_{pulse}\right)^2 + \left(\frac{I_{leakage}}{C}\Delta T_{end\_start\_pulse}\right)^2 + \left(\frac{V}{C}\Delta C\right)^2}$$

Assuming that the time from the start to the end of the start pulse is well controlled, Equation (2) can be expressed as:

$$\Delta V = \frac{\sqrt{(T_{pulse}\Delta I_{generate})^2 + (T_{end\_start\_pulse}\Delta I_{leakage})^2 + (I_{generate}\Delta T_{pulse})^2 + (I_{leakage}\Delta T_{end\_start\_pulse})^2 + (V\Delta C)^2}}{(C)} \quad (3)$$

$$\Delta V = \sqrt{\frac{(T_{pulse}\Delta I_{generate})^2 + (T_{end\_start\_pulse}\Delta I_{leakage})^2 + (I_{generate}\Delta T_{pulse})^2 + (V\Delta C)^2}{(C)}}$$

When calculating such as a standard of deviation sigma (e.g., a quality metric) of the dispersion (e.g., jitter) of the pulse width of an input clock (e.g., $\sigma_{Tpulse}$), all other variations in the voltage are minimized (e.g., substantially less) as follows:

$$(I_{generate}\Delta T_{pulse})^2 >> (T_{pulse}\Delta I_{generate})^2 + (T_{end\_start\_pulse}\Delta I_{leakage})^2 + (V\Delta C)^2 \quad (4)$$

When Equation (4) is used to represent a variation of n measurements taken across a time interval Δt having fixed PVT conditions, each of the terms $\Delta I_{generate}(t)$, $\Delta I_{leakage}(t)$, and $\Delta C(t)$ is substantially minimal because the current source, leakage sources and capacitance are invariant across time (notwithstanding being variant with respect to varying PVT conditions). Accordingly, measurements are taken at a given PVT point (e.g., at which the measurement system is calibrated) such that the measurements do not substantially vary as a function of PVT conditions. The measurements substantially vary as a function of PVT conditions when, for example, the measurement error of the resultant digital value exceeds a range of plus-or-minus two counts of a 12-bit ADC that is operating over an input range of around three volts (wherein the count is expressed, e.g., as a ratio of maximum voltage of the sampling input of the ADC to the number of bits of the ADC).

The resulting measurement (e.g., count) is generated by buffering the sampled capacitance and providing a resultant voltage count in response to an analog-to-digital conversion of the buffered capacitance. The count of the resultant voltage can be expressed in as:

$$V_{Re\, Sul\, tan\, t} = A_v(v)v + \phi \quad (5)$$

where A is the gain of the ADC and φ is the offset of the ADC. Accordingly, the variation in the count of the resultant count can be expressed as:

$$\Delta V_{Resultant} = \quad (6)$$
$$\sqrt{\left(\frac{\partial V_{Resultant}}{\partial A_V}\Delta A_V\right)^2 + \left(\frac{\partial V_{Resultant}}{\partial V_{in}}\Delta V_{in}\right)^2 + \left(\frac{\partial V_{Resultant}}{\partial \phi}\Delta\phi\right)^2}$$

$$\Delta V_{Resultant} = \sqrt{(V\Delta A_V)^2 + \left(\left(A_V + V\frac{dA_V}{dV_{in}}\right)\Delta V_{in}\right)^2 + (\Delta\phi)^2}$$

Because the ADC gain is unlikely to vary substantially measurement-to-measurement at a fixed PVT condition (such that $\Delta A_v$ is minimal), and the amounts of the offsets provided by the ADC and/or operational amplifier are also unlikely to substantially vary for a fixed PVT condition (such that $\Delta\phi$ is also minimal), the variation in the count of the resultant voltage can be expressed as:

$$\Delta V_{Resultant} \approx \left(A_V + V\frac{dA_V}{dV_{in}}\right)\Delta V_{in} = A_V\Delta V_{in} + V\frac{dA_V}{dV_{in}}\Delta V_{in} \quad (7)$$

Accordingly, the variation in the resultant (count) can be expressed as a result of the variation in the input voltage plus an error term due to non-constant gain (e.g., differential non-linearity) across the input voltage range. The differential non-linearity (for a 12-bit ADC has an operating voltage of around three volts, as discussed above) is thus limited to plus-or-minus two counts (e.g., having a value that is one or two counts above or below a resultant digital value having no measurement error).

The operations described with respect to FIG. 5 can be performed as an (analog) built-in self-test (BIST) function of a device-under-test using a variety of "bench" or field platforms. For example, a JTAG (Joint Test Action Group) facility can use a debug communication channel (DCC) to exercise measurement functions of the device-under-test across the substrate boundary of the device-under-test. The measurement functions can be used to provide an accurate measurement of the output of an internal clock generator, for example, when the internal clock generator is formed in the same substrate as the measurement system as disclosed herein (in contrast to external systems which typically are used to test derivative clock signals that can be divided in frequency or subjected to effects of hysteresis in the circuitry used to generate the derivative clock signals):

The various embodiments described above are provided by way of illustration only and should not be construed to limit the claims attached hereto. Those skilled in the art will readily recognize various modifications and changes that could be made without following the example embodiments and applications illustrated and described herein, and without departing from the true spirit and scope of the following claims.

What is claimed is:

1. An integrated circuit comprising:
   a clock lead;
   an enable lead;
   a VCC lead;
   a VSS lead;
   a first transistor, a second transistor, and a third transistor coupled in series between the VCC and VSS leads, each transistor having a control gate, the control gate of the first transistor being coupled to the enable lead by first gating circuitry, the control gate of the second transistor being coupled to the clock lead by second gating circuitry, and the control gate of the third transistor being coupled to the enable lead by third gating circuitry;
   a capacitor having one terminal coupled to a coupling between the second and third transistors and another terminal coupled to the VSS lead;
   an operational amplifier having an input coupled to the one terminal of the capacitor and having an output; and
   an analog to digital converter having an input coupled to the output of the operational amplifier and an output.

2. The integrated circuit of claim 1 in which the operational amplifier has an enable input and including an enable transistor coupled between the enable input of the operational amplifier and one of the VCC and VSS leads.

3. The integrated circuit of claim 1 in which the operational amplifier has an enable input and including an enable transistor coupled between the enable input of the operational amplifier and the VSS lead.

4. The integrated circuit of claim 1 in which the operational amplifier has an enable input and including an enable transistor having an internal enable control input and controller circuitry having an internal enable output coupled to the internal enable control input of the enable transistor.

5. The integrated circuit of claim 1 in which the operational amplifier has another input coupled to the output of the operational amplifier and acts as a unity gain operational amplifier.

6. The integrated circuit of claim 1 in which the enable lead is an external enable lead, and the first gating circuitry includes a first logic gate having an external enable input coupled to the external enable lead, an internal enable input, a disable input, and an output, and a level shifter having an input coupled to the output of the first logic gate and an output coupled to the control gate of the first transistor.

7. The integrated circuit of claim 6 in which the second gating includes flip-flops having clock inputs coupled to the clock lead and an output coupled to the disable input.

8. The integrated circuit of claim 1 in which the enable lead is an external enable lead, and the third gating circuitry includes an inverter having an external enable input coupled to the external enable lead and an output, and a level shifter having an input coupled to the output of the inverter and an output coupled to the control gate of the third transistor.

9. The integrated circuit of claim 1 in which the second gating circuitry includes a divide by 2 flip-flop having an input coupled to the clock lead and an output coupled to the control gate of the second transistor.

10. The integrated circuit of claim 1 in which the second gating circuitry includes a divide by 2 flip-flop having an input coupled to the clock lead and an output, an enable synchronizer having a first input coupled to the output of the divide by 2 flip-flop, a second input, and an output, and a level shifter having an input coupled to the output of the enable synchronizer and an output coupled to the control gate of the second transistor.

11. The integrated circuit of claim 10 in which the second gating includes flip-flops having clock inputs coupled to the clock lead and an output coupled to the second input of the enable synchronizer.

12. The integrated circuit of claim 1 in which there are plural first transistors coupled in parallel, plural second transistors coupled in parallel, and plural third transistors coupled in parallel, and including decoder circuitry having an input and plural outputs selecting a first transistor, a second transistor, and a third transistor for a series coupling between the VCC lead and the VSS lead.

13. The integrated circuit of claim 12 in which there are plural first transistors coupled in parallel, plural second transistors coupled in parallel, and plural third transistors coupled in parallel, and including decoder circuitry having an input and plural outputs selecting a first transistor, a second transistor, and a third transistor for a series coupling between the VCC lead and the VSS lead, and controller circuitry having an output coupled to the input of the decoder circuitry, an input coupled to the output of the analog to digital converter, and a system interface.

14. The integrated circuit of claim 1 including a phase locked loop circuit having an output coupled to the clock lead.

15. The integrated circuit of claim 1 including controller circuitry having an external system interface, an input coupled with the output of the analog to digital converter, and an output coupled to the operational amplifier.

16. The integrated circuit of claim 1 including a central processing unit having a system interface, and controller circuitry having an external system interface coupled with the external system interface of the central processing unit, an input coupled with the output of the analog to digital converter, and an output coupled to the operational amplifier.

* * * * *